United States Patent
Muka

(10) Patent No.: US 6,193,506 B1
(45) Date of Patent: Feb. 27, 2001

(54) APPARATUS AND METHOD FOR BATCH THERMAL CONDITIONING OF SUBSTRATES

(75) Inventor: Richard S. Muka, Topsfield, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

(21) Appl. No.: 08/449,809

(22) Filed: May 24, 1995

(51) Int. Cl.⁷ ...................................... F27D 3/12
(52) U.S. Cl. .................. 432/241; 432/36; 432/239; 432/247; 432/253; 432/258
(58) Field of Search ................ 432/36, 239, 241, 432/247, 253, 258

(56) References Cited

U.S. PATENT DOCUMENTS

| | | | |
|---|---|---|---|
| 3,272,350 | 9/1966 | Pflaumer et al. | 214/1 |
| 3,935,646 | 2/1976 | Grandine et al. | 34/92 |
| 4,381,965 * | 5/1983 | Maher, Jr. et al. | 156/345 |
| 4,490,111 | 12/1984 | Yakura | 432/205 |
| 4,597,736 | 7/1986 | Moffat | 432/26 |
| 4,610,628 * | 9/1986 | Mizushina | 432/241 |
| 4,715,812 | 12/1987 | Von Matuschka et al. | 432/258 |
| 4,715,921 | 12/1987 | Maher et al. | 156/345 |
| 4,721,462 | 1/1988 | Collins, Jr. | 432/253 |
| 4,770,630 * | 9/1988 | Akimoto et al. | 432/121 |
| 4,951,601 | 8/1990 | Maydan et al. | 118/719 |
| 5,044,752 * | 9/1991 | Thurfjell et al. | 356/400 |
| 5,046,909 | 9/1991 | Murdoch | 414/225 |
| 5,060,354 | 10/1991 | Chizinsky | 29/25.02 |
| 5,090,900 | 2/1992 | Rudolf et al. | 432/239 |
| 5,151,008 | 9/1992 | Ishida et al. | 414/744.5 |
| 5,183,370 | 2/1993 | Cruz | 414/416 |
| 5,207,578 * | 5/1993 | Sakata | 432/241 |
| 5,249,960 * | 10/1993 | Monoe | 432/241 |
| 5,252,807 | 10/1993 | Chinzinsky | 219/390 |
| 5,297,956 * | 3/1994 | Yamabe et al. | 432/5 |
| 5,316,472 * | 5/1994 | Niino et al. | 432/241 |
| 5,404,894 | 4/1995 | Shiraiwa | 134/66 |
| 5,512,320 | 4/1996 | Turner et al. | 427/255 |

* cited by examiner

Primary Examiner—Denise L. Ferensic
Assistant Examiner—Jiping Lu
(74) Attorney, Agent, or Firm—Perman & Green, LLP

(57) ABSTRACT

A substrate heater having a chamber, a heating element located in the chamber, and an elevator having a substrate holder. The holder can hold a plurality of planar substrates in a general spaced stacked configuration. The holder can be moved to allow substrates to be inserted and removed from various locations on the holder. In one embodiment the substrates are located very close to each other to accelerate the rate of heat transfer to newly inserted substrates. In another embodiment, the holder has an individual horizontal heater on the elevator for each substrate.

30 Claims, 4 Drawing Sheets

APPARATUS AND METHOD FOR BATCH THERMAL CONDITIONING OF SUBSTRATES

BACKGROUND OF THE INVENTION

1. Field of the Invention

This invention relates to a thermal conditioning apparatus for planar substrates and, more particularly, to a batch treating apparatus and method.

2. Prior Art

U.S. Pat. No. 4,597,736; 5,252,807 and 5,060,354 disclose thermal processors for wafers. U.S. Pat. No. 4,715,921 and 4,951,601 disclose multi-chamber wafer processing systems. U.S. Pat. No. 4,381,965 discloses an elevator-type multiple-electrode mechanism. U.S. Pat. No. 4,715,812; 4,770,630; 3,935,646; 4,490,111 and 4,721,462 disclose various heating assemblies.

SUMMARY OF THE INVENTION

In accordance with one embodiment of the present invention an apparatus for heating a plurality of planar substrates is provided. The apparatus comprises a chamber, a heater, and an elevator. The heater is located in the chamber. The elevator is located, at least partially, in the chamber. The elevator has a substrate holding stack and means for moving the substrate holding stack.

In accordance with one method of the present invention a method of heating a planar substrate is provided comprising steps of providing a substrate heating apparatus adapted to simultaneously heat a plurality of substrates, the apparatus having a substrate holder for holding the substrates in a spaced stacked configuration; inserting a substrate into the apparatus and into the holder in very close proximity to adjacent substrates; and transferring heat to the inserted substrate from both a heater of the apparatus and the adjacent substrates wherein the heat transfer from the adjacent substrates accelerates the rate of temperature rise in the inserted substrate.

BRIEF DESCRIPTION OF THE DRAWINGS

The foregoing aspects and other features of the invention are explained in the following description, taken in connection with the accompanying drawings, wherein.

DETAILED DESCRIPTION OF THE PREFERRED EMBODIMENT

Figure 1:
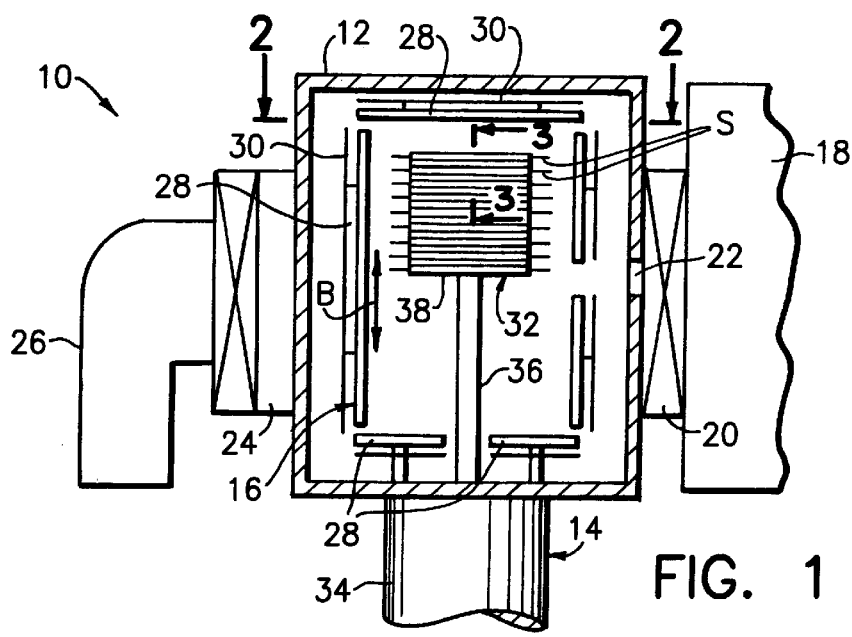
FIG. 1 is a schematic cross-sectional side view of an apparatus incorporating features of the present invention.

Referring to FIG. 1, there is shown a partial cross-sectional side view of an apparatus 10 incorporating features of the present invention. Although the invention will be described with reference to the embodiments shown in the drawings, it should be understood that the present invention can be embodied in various different types and kinds of alternate embodiments. In addition, any suitable size, shape or type of elements or materials could be used.

The apparatus 10 is a thermal conditioning apparatus for use with a plurality of planar substrates, such as semiconductor wafers or flat panel displays. The apparatus 10 is generally intended for use with a multi-chamber processing system for substrates such as disclosed in U.S. Pat. No. 4,715,921 and 4,951,601 which are hereby incorporated by reference in their entirety. However, the apparatus 10 could be used with any suitable type of substrate processing system.

The apparatus 10 generally comprises a chamber 12, an elevator 14, and a heating system 16. The apparatus 10 is shown connected to a substrate transport platform 18 by a slot valve assembly 20. The chamber 12 is preferably water cooled and has an entrance 22 at the slot valve assembly 20. A water cooled baffle 24 and a cryopump 26 are connected to the chamber 12.

Figure 2:
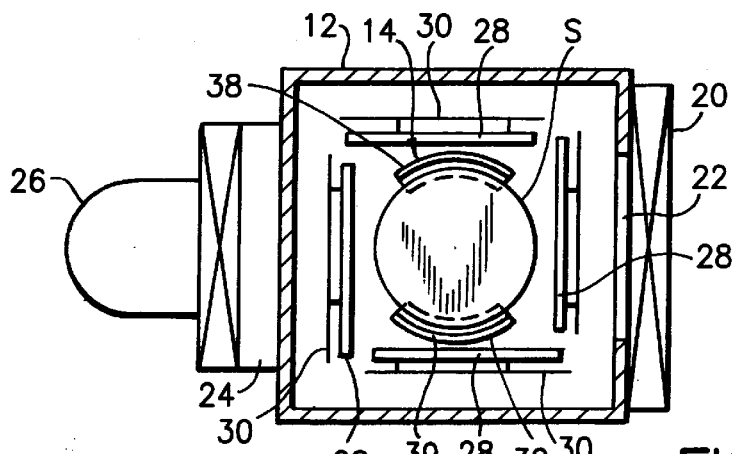
FIG. 2 is a schematic cross-sectional top view of the apparatus shown in FIG. 1 taken along line 2—2.

Referring also to FIG. 2, the heating system 16 includes heating elements 28. The heating elements 28 are located in the chamber 12 and surround a portion of the elevator 14. Radiation shields 30 are located behind the heating elements 28. Any suitable type heating elements could be used. In alternate embodiments, other types of heating systems could also be used.

Figure 3:
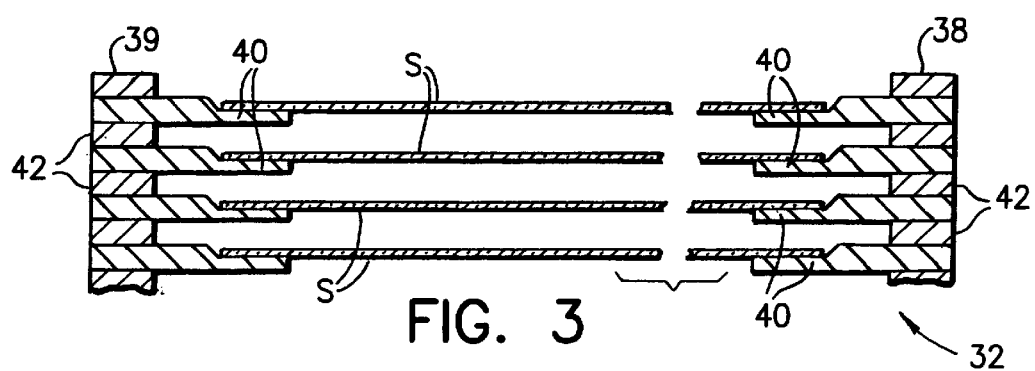
FIG. 3 is an enlarged partial cross-sectional view of the substrates and substrate holder shown in FIG. 1 taken along line 3—3.

The elevator 14 generally comprises a substrate holding stack 32 for holding a plurality of substrates S and an elevator drive section 34. The drive section 34 is primarily located outside the chamber 12. More specifically, the drive section 34 is attached to the bottom of the chamber 12. Any suitable type of elevator drive could be used. Two drive arms 36 (only one of which is shown) extend into the chamber 12 from the drive section 34. Referring also to FIG. 3, the substrate holding stack 32 is actually comprised of two separate and spaced racks 38, 39. Each rack 38, 39 is attached to a top of one of the drive arms 36. The racks 38, 39 are mirror images of each other and operably face each other. Each rack 38, 39 has a plurality of substrate support ledges 40 separated by spacers 42. In the embodiment shown, the substrates S are disk shaped semiconductor wafers. The ledges 40 are suitably sized, shaped and spaced to individually support the substrates S in a stacked configuration. More specifically, the inwardly projecting ledges 40 are adapted to support the substrates S on a portion of the substrates' edges or perimeters. The spacers 42 can be suitably selected to provide any type of spacing between substrates in the stack 32. However, in a preferred embodiment, the stack 32 is constructed to hold adjacent stacked substrates at a centerline distance of about 6 mm. However, other distances could be provide such as between about 6 mm to about 20 mm. As used herein the terms "stack" and "stacked" are intended to mean aligned in a row with substantially nothing except a gap between adjacent substrates or between a substrate and an adjacent heat sink. One such "stack" or "stacked" configuration is shown in FIG. 3 with only the small ledges 40 between adjacent substrates S. In alternate embodiments, other shapes or configurations could be provided for the holding stack 32. Other types of connections could be provided between the elevator drive and the holding stack. The elevator 14 can vertically move the stack 32, as illustrated by arrow B, by moving the drive arms 36 to thereby vertically move substrates S in the chamber 12. This allows a substrate transport mechanism (not shown) in the platform 18 to be passed through the entrance 22 to remove any one of the substrates S from the stack 32, or insert a substrate into the stack, at any vertical location in the stack 32.

The apparatus 10 allows for batch heating of a plurality of substrates at the same time. Therefore, a supply of heated substrates is available to be transported to a processor chamber of the system. In this fashion, the system does not have to wait for a substrate to be heated. Hence, the substrate processing system that the apparatus 10 is attached to is faster than with prior art single substrate heaters and, only requires the one apparatus 10; not multiple single substrate heaters. One of the features of the present invention is accomplished through the use of the batch apparatus 10. In the single heaters of the prior art, virtually all the heat transported to a substrate came directly from a heater. However, with the present invention, the supply of substrates in the chamber 12 act as a heat sink. When a cold substrate is inserted into the chamber 12, the substrates already in the stack 32 transfer some of their heat to the newly inserted substrate. Thus, the newly inserted substrate is heated by both the heating system and the heated substrates already in the stack. This accelerates the rate of heating of the newly inserted substrate. The stack 32 holds the substrates S above and below each other with relatively nothing between the substrates (except the relatively small areas of the ledges 40). Thus, heat can be transmitted from adjacent substrates relatively easily and without significant obstruction. The substrates already heated and in the stack 32 are able to function as heat sinks for newly inserted substrates due to the stacked very close proximity of the substrates without significant heat transfer obstructions between the adjacent substrates. The close proximity of the substrates to adjacent substrates in the stack 32 aids in the substrate-to-substrate heat transfer. In alternate embodiments, additional heat sinks to store heat and transfer heat to newly inserted cold substrates could be provided in the chamber 12. In the embodiment shown, the racks 38, 39 also act as a heat sink.

Figure 4:
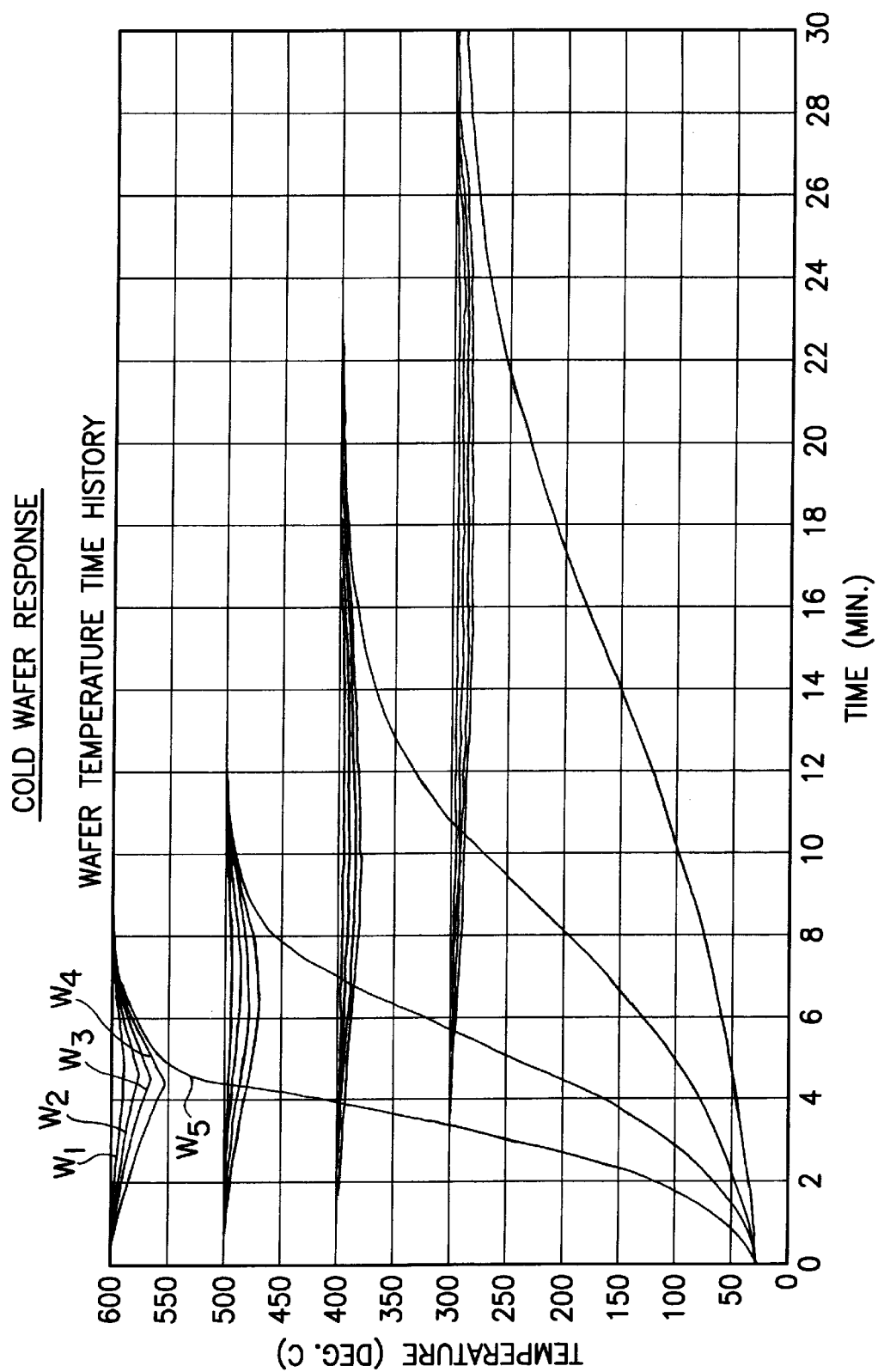
FIG. 4 is a graph of a cold wafer response with temperature and time when a wafer is inserted into the apparatus shown in FIG. 1 for four different base temperatures.

Referring also to FIG. 4, there is shown a graph of four different responses to the introduction of a cold substrate (25° C.) into a stack of substrates in the apparatus 10 at four different apparatus base temperatures (600° C., 500° C., 400° C., 300° C.). At the apparatus base temperature of 600° C. the introduction of the cold substrate $W_5$ into the stack causes the temperature of the other substrates $W_4$, $W_3$, $W_2$, $W_1$, in the stack to drop temporarily. The closer the other substrates are to the inserted cold substrate $W_5$, the larger the temperature drop. However, the temperature drop in the other substrates is less than 50° C. The inserted substrate $W_5$, on the other hand, is rapidly heated due to the heat transfer from the other substrates $W_4$ –$W_1$ and reaches the apparatus base temperature in about 8 minutes. The responses for the other apparatus base temperatures of 500° C., 400° C. and 300° C. demonstrate that the higher the apparatus base temperature the quicker that the inserted cold substrate will approach that temperature. In any event, the use of a batch heating apparatus accelerates heating of newly inserted cold substrates due to the transfer of heat from both the heating system 16 and the heated substrates $W_4$ –$W_1$ already in the stack 32.

Figure 5:
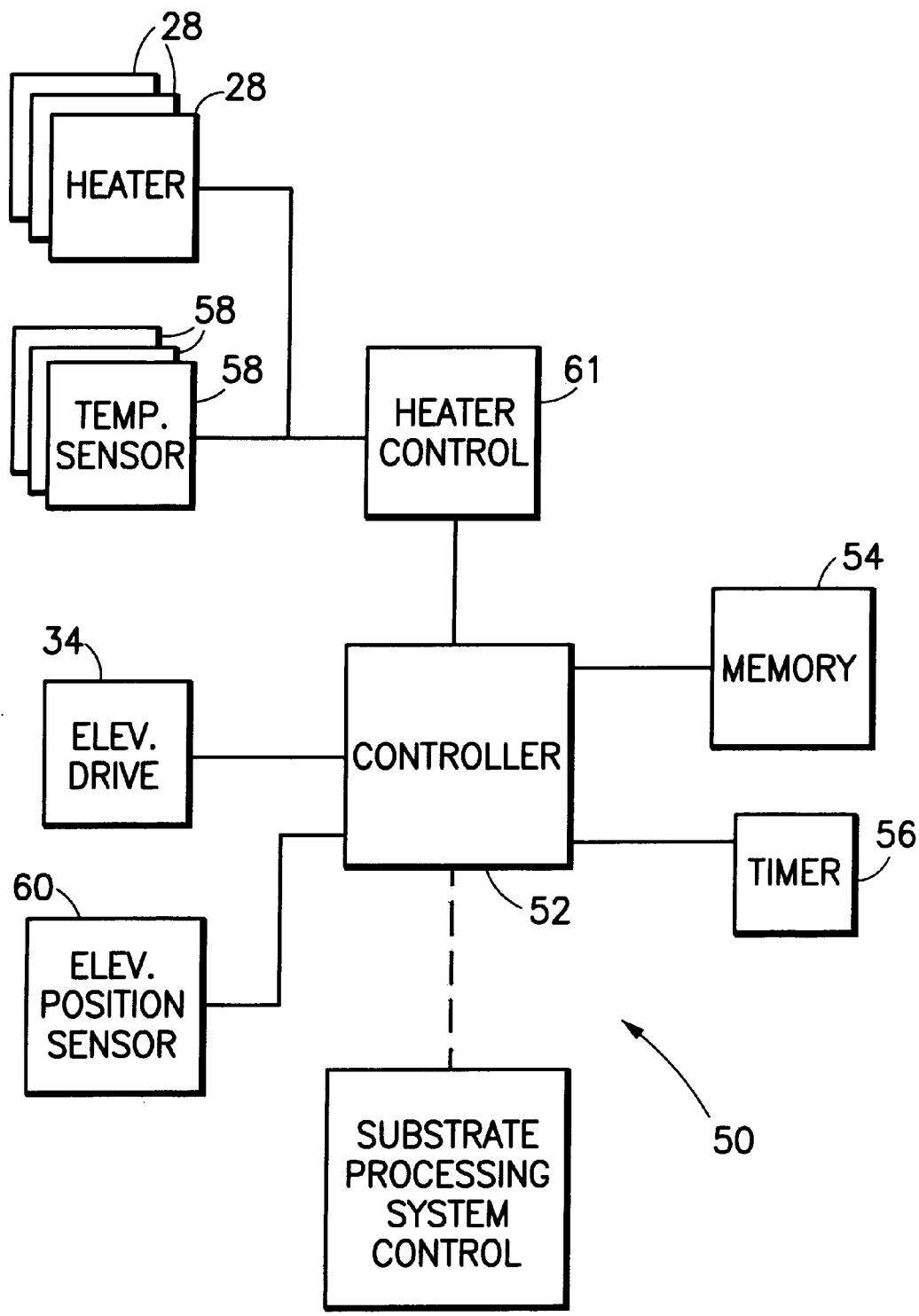
FIG. 5 is a schematic diagram of a control system for use with the apparatus shown in FIG. 1.

Referring also to FIG. 5, there is shown a block diagram of one type of control system 50 for use with the apparatus 10. The system includes a controller 52, a memory 54, a timer 56, temperature sensors 58, an elevator position sensor 60, heater 28, and a heater control 61. The controller 52 is preferably a microprocessor. The controller 52 is shown connected to the substrate processing system control, but may be integral therewith. The temperature sensors 58 are located in the chamber 12. Any suitable number of temperature sensors could be provided including only one or one for each substrate holding position in the stack 32. The memory 54 can be programmed with algorithms corresponding to predetermined data, such as shown in FIG. 4, of temperature, time and location of substrate holding positions from an inserted cold wafer. The controller 52 can use this predetermined data along with information from the timer 56, temperature sensors 58 and elevator position sensor 60 to control insertion into and removal of wafers from the stack 32. The memory 54 can be used to record when the individual wafers are inserted into the stack 32 and at what location in the stack the wafers are inserted. Preferably, the controller 52 will cause the elevator drive 34 to move to a suitable position to allow for removal of only hot wafers and, insert new cold wafers only in locations adjacent hot or substantially hot wafers already in the stack. This type of control can be used to insure that newly inserted cold wafers are properly located in the stack to promote the most rapid rate of heat transfer to the newly inserted cold wafers and, insure that only properly heated wafers are removed from the stack 32. In alternate embodiments, any suitable type of control system could be provided.

Figure 6:
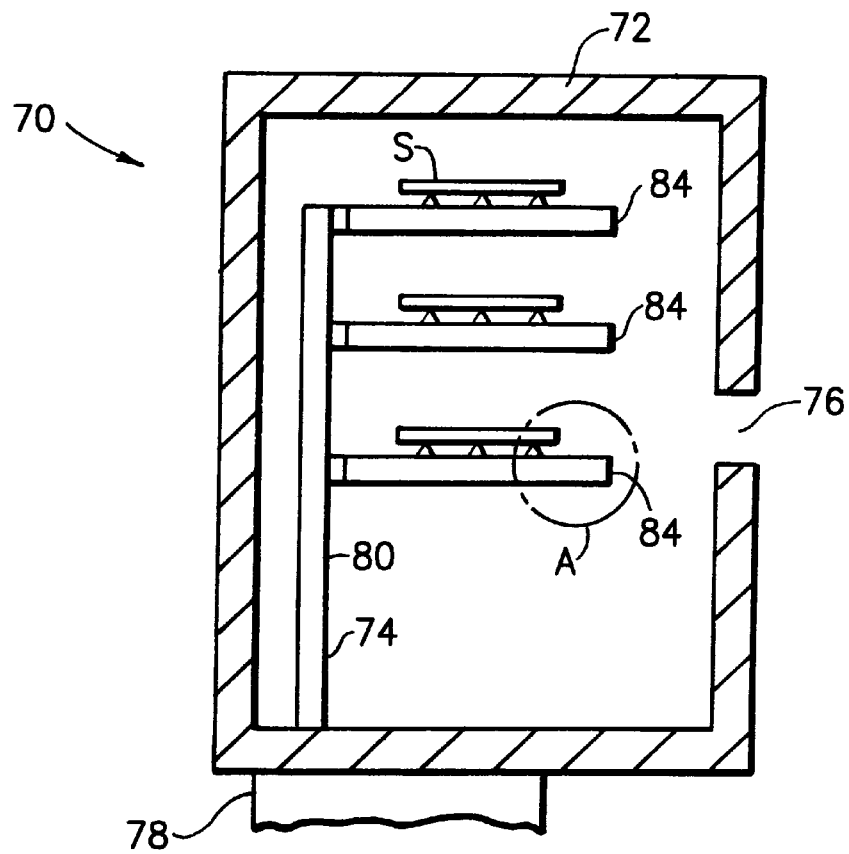
FIG. 6 is a schematic cross-sectional view of a design known in the prior art.
Figure 6A:
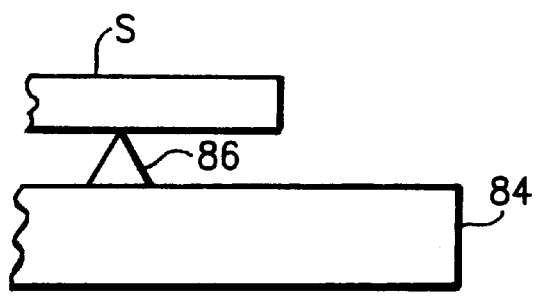
FIG. 6A is an enlarged view of area A shown in FIG. 5.

Referring now to FIGS. 6 and 6A, a system similar to the known prior art is shown. In this prior art design the apparatus 70 includes a chamber 72 and a combined substrate holder, heater and movement mechanism 74. The chamber 72 has an entrance 76 for a substrate transport mechanism (not shown) to insert substrates into and remove substrates from the chamber 72. The combined mechanism 74 includes an elevator drive 78, a drive arm 80, and heating elements 84. The elevator drive 78 is adapted to vertically move the drive arm 80 up and down in the chamber 12. The heating elements 84 are stationarily connected to the drive arm 80. On the top surface of each of the heating elements 84 are substrate holders or supports 86. The substrates S are supported on the tips of the supports 86 at a fixed distance from the heating elements 84. The combined mechanism 74 is adapted to move the heating elements 84 and supports 86 vertically up and down in the chamber 72 for inserting and removing the substrates S through the entrance 76.

For the invention shown in FIGS. 1–5, the close proximity with adjacent or proximal substrates with adjacent or proximal substrates in a stack provides substantially the same thermal performance that the individual separate heaters 84 for each substrate in FIG. 6 could provide. However, the stacked configuration of the present invention is much less expensive than individual separate heaters for each substrate. The stacked configuration also allows for a smaller and shorter elevator to be used than would otherwise be needed. The stacked configuration might require a maximum lifting load of about 50 pounds. Individual separate heaters for each substrate could result in the need for an elevator sized to lift about 500 pounds. Obviously, an elevator designed to lift 50 pounds is less expensive than an elevator designed to lift 500 pounds. Size constraints in the prior art apparatus 70 limits the mechanism 74 to a capacity of about seven substrates. The apparatus 10 can hold much more, such as about twenty or thirty substrates. Thus, the apparatus 10 provides good thermal performance (substrates are heated rapidly) and a large substrate capacity, but without an increase in overall size relative to prior art designs.

It should be understood that the foregoing description is only illustrative of the invention. Various alternatives and modifications can be devised by those skilled in the art without departing from the spirit of the invention. Accordingly, the present invention is intended to embrace all such alternatives, modifications and variances which fall within the scope of the appended claims.

What is claimed is:

1. An apparatus for heating a plurality of planar substrates, the apparatus comprising:
   a chamber;
   a heater located in the chamber;
   an elevator located, at least partially, in the chamber, the elevator having a substrate holding stack and means for moving the substrate holding stack, the substrate holding stack being adapted to hold a plurality of substrates in a spaced generally open stacked configuration with sides of the substrates directly opposite one another to directly transfer heat between adjacent substrates; and
   means for controlling movement of the elevator such that a newly inserted cold substrate is located at a predetermined location in the stack adjacent to at least one hot substrate already in the stack without moving the stack out of the chamber such that heat can be transferred to the newly inserted cold substrate from both the heater and adjacent substrates in the stack.

2. An apparatus as in claim 1 wherein the heater includes heating elements located on at least three sides of the elevator in the chamber.

3. An apparatus as in claim 1 wherein the elevator includes an elevator drive located outside the chamber.

4. An apparatus as in claim 1 wherein the substrate holding stack has two opposing substrate racks.

5. An apparatus as in claim 4 wherein each substrate rack has a stack of inwardly projecting ledges adapted to have a perimeter portion of the substrate located on each ledge.

6. An apparatus as in claim 1 wherein the substrate holding stack is adapted to hold adjacent stacked substrates at a centerline distance of about 6 mm.

7. An apparatus as in claim 1 wherein the means for controlling movement of the elevator only allows substrates heated to a predetermined temperature to be removed from the stack.

8. An apparatus as in claim 1 further comprising a control system including a timer, an elevator position sensor, a memory and the means for controlling movement of the elevator, wherein substrates are removed from the stack based, at least partially, upon proximity to other substrates subsequently inserted into the chamber.

9. A system for controlling insertion and removal of substrates with a thermal conditioning apparatus comprising:
   a chamber;
   a movement mechanism connected to a substrate holder of the thermal conditioning apparatus, the holder having a holding stack which is suitably sized and shaped to hold a plurality of substrates in a very close proximity general open stacked configuration with sides of the substrates directly opposite one another to directly transfer heat between adjacent substrates, the holding stack being located in the chamber; and
   means for controlling movement of the movement mechanism including a controller for moving the substrate holder to locations for inserting a cold substrate into the holding stack adjacent to at least one hot substrate already in the holder without moving the holding stack out of the chamber, such that heat is transferred from the hot substrate already in the holder to the inserted cold substrate, and for removing hot substrates from the holder.

10. A system as in claim 9 further comprising an elevator position sensor connected to the controller.

11. A system as in claim 9 further comprising a temperature sensor connected to the controller.

12. A system as in claim 9 further comprising means for determining whether a substrate should be removed from the apparatus based upon temperature in the apparatus, time of the substrate in the apparatus, and proximity of the substrate to other substrates subsequently inserted into the holder.

13. A method of heating a planar substrate comprising steps of:
   providing a substrate heating apparatus adapted to simultaneously heat a plurality of substrates, the apparatus having a chamber with a heater and a substrate holder with a holding stack inside the chamber for holding the substrates in a very closely spaced stacked open configuration with sides of the substrates directly opposite one another to directly transfer heat between adjacent substrates;
   inserting a substrate into the apparatus and into the holding stack in close proximity to adjacent substrates without moving the holding stack out of the chamber; and
   transferring heat to the inserted substrate from both the heater of the apparatus and the adjacent substrates, wherein the heat transfer from the adjacent substrates accelerates the rate of temperature increase in the inserted substrate.

14. A method as in claim 13 further comprising vertically moving the substrate holder.

15. A method as in claim 14 further comprising removing a substrate from the holder and the apparatus after the holder is vertically moved.

16. A method as in claim 13 wherein the step of inserting comprises locating the inserted substrate at a centerline distance relative to adjacent substrates of about 6 mm to about 20 mm.

17. A substrate processing system comprising:
   a transport platform having a substrate transport mechanism;
   substrate processing chambers connected to the transport platform; and
   a heat transfer apparatus connected to the transport platform, the heat transfer apparatus having a chamber, a substrate holding stack located in the chamber, means for directly transferring heat between adjacent substrates in the holding stack, and means for allowing the substrates to be inserted into and removed from the holding stack without moving the holding stack out of the chamber.

18. A method of processing substrates in a substrate processing system comprising steps of:
   transporting substrates individually into a chamber of a heat transfer apparatus by a transport mechanism of a transport platform connected to the heat transfer apparatus;
   holding the substrates in a substrate holding stack inside the chamber of the heat transfer apparatus in a general open spaced stacked configuration wherein sides of the substrates are located directly opposite adjacent substrates; and
   transferring heat directly between adjacent substrates in the stack inside of the chamber.

19. A method as in claim 18 further comprising the step of transporting substrates individually out of the chamber from the substrate holding stack by the transport mechanism to a single substrate processing chamber.

20. A method as in claim 19 further comprising the step of transporting a substrate in the single substrate processing chamber by the transport mechanism out of the single substrate processing chamber to a wafer queuing station having means for holding multiple stacked substrates.

21. A method as in claim 18 wherein the step of transporting substrates individually into the chamber comprises removing the substrates individually from a wafer queuing station connected to the transport platform, the wafer queuing station having means for holding multiple stacked substrates and an elevator for moving the multiple stacked substrates.

22. An apparatus for heating a plurality of substrates, the apparatus comprising:

a chamber;

a heater connected to the chamber;

a substrate support movably located, at least partially, in the chamber, the substrate support having a substrate holder adapted to hold a plurality of substrates in a spaced generally open stacked configuration with sides of the substrates directly opposite one another to directly transfer heat between adjacent substrates; and a controller for controlling movement of the substrate support that a newly inserted relatively cold substrate is located at a predetermined location in the substrate support adjacent to at least one relatively hot substrate already in the substrate support without moving the substrate support out of the chamber such that heat can be transferred to the newly inserted relatively cold substrate from both the heater and the adjacent relatively hot substrate.

23. A system for controlling insertion and removal of substrates with a thermal conditioning apparatus comprising:

a chamber;

a movement mechanism connected to a substrate holder of the thermal conditioning apparatus, the holder having a holding stack which is suitably sized and shaped to hold a plurality of substrates in a proximity general open stacked configuration with sides of the substrates directly opposite one another to directly transfer heat between adjacent substrates, the holding stack being located in the chamber; and a controller for controlling movement of the movement mechanism for moving the substrate holder to locations for inserting at least one relatively cold substrate into the holding stack adjacent to at least one relatively hot substrate already in the holder without moving the holding stack out of the chamber, such that heat is transferred from the at least one relatively hot substrate already in the holder to the inserted at least one relatively cold substrate, and for removing hot substrates from the holder.

24. A method of heating a planar substrate comprising steps of:

providing a substrate heating apparatus adapted to simultaneously heat a plurality of substrates, the apparatus having a chamber with a heater and a substrate holder inside the chamber for holding the substrates in a spaced stacked configuration with sides of the substrates directly opposite one another to directly transfer heat between adjacent substrates;

inserting a substrate into the chamber and into the substrate holder in close proximity to at least one adjacent substrate without moving the substrate holder out of the chamber; and transferring heat to the inserted substrate from both the heater of the apparatus and the at lest one adjacent substrate, wherein the heat transfer from the adjacent substrate accelerates the rate of temperature increase in the inserted substrate.

25. A substrate processing system comprising:

a transport platform having a substrate transport mechanism;

substrate processing chambers connected to the transport platform; and a heat transfer apparatus connected to the transport platform, the heat transfer apparatus having a chamber, a substrate holding stack located in the chamber which is sized and shaped to allow for directly transferring heat between adjacent substrates in the holding stack, wherein the apparatus is adapted to allow the substrates to be inserted into and removed from the holding stack without moving the holding stack out of the chamber.

26. A method of processing substrates in a substrate processing system comprising steps of:

transporting substrates separately into a chamber of a heat transfer apparatus by a transport mechanism;

holding the substrates inside the chamber of the heat transfer apparatus in a general spaced stacked configuration wherein sides of the substrates are located directly opposite adjacent substrates; and transferring heat directly between adjacent substrates inside of the chamber.

27. A method as in claim 26 wherein the step of transporting comprises locating at least one newly inserted substrate into the chamber directly opposite one of the substrates already in the chamber.

28. A method as in claim 26 further comprising determining when at least one of the substrates can be removed from the chamber after obtaining a predetermined temperature, the step of determining being based, at least partially, on a temperature of at least one of the substrates adjacent the at least one substrate.

29. A method of heat transfer with substrates comprising steps of:

inserting at least one first substrate into a heat transfer chamber opposite at least one second substrate already in the chamber, at least one planar side of the at least one first substrate facing at least one planar side of the at least one second substrate, the first and second substrates having different temperatures relative to each other such that the first and second substrates transfer heat between each other; and determining when the at least one first substrate will obtain a predetermined temperature based, at least partially, on temperature of the at least one second substrate.

30. A method of determining when to remove a first substrate from a substrate heat transfer apparatus comprising the steps of:

determining a temperature of at least one second substrate already in the heat transfer apparatus when the first substrate is inserted into the heat transfer apparatus;

determining a change in temperature of the first substrate while in the heat transfer apparatus based, at least partially, on the temperature of the at least one second substrate already in the heat transfer apparatus; and determining based upon the change in temperature, when the first substrate reaches a predetermined temperature for removal from the heat transfer apparatus.

* * * * *